(12) United States Patent
Chowdhury et al.

(10) Patent No.: US 7,471,340 B1
(45) Date of Patent: Dec. 30, 2008

(54) VIDEO QUALITY ADAPTIVE VARIABLE-RATE BUFFERING METHOD AND SYSTEM FOR STABILIZING A SAMPLED VIDEO SIGNAL

(75) Inventors: Ahsan Chowdhury, Austin, TX (US); Rahul Singh, Austin, TX (US); John L. Melanson, Austin, TX (US); James A. Antone, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 693 days.

(21) Appl. No.: 11/088,447

(22) Filed: Mar. 24, 2005

Related U.S. Application Data

(60) Provisional application No. 60/618,303, filed on Oct. 13, 2004.

(51) Int. Cl.
*H03M 1/12* (2006.01)
*H03L 7/00* (2006.01)
*H04N 9/64* (2006.01)

(52) U.S. Cl. .................. 348/572; 348/536; 348/714
(58) Field of Classification Search ................ 348/572, 348/714, 720, 536, 500; 341/155–172, 61
See application file for complete search history.

(56) References Cited

U.S. PATENT DOCUMENTS

| | | | |
|---|---|---|---|
| 4,689,664 A | | 8/1987 | Moring et al. |
| 5,786,778 A | * | 7/1998 | Adams et al. .................. 341/61 |
| 5,936,678 A | * | 8/1999 | Hirashima .................. 348/537 |
| 5,982,305 A | * | 11/1999 | Taylor .......................... 341/61 |
| 6,097,444 A | * | 8/2000 | Nakano ....................... 348/607 |
| 6,188,443 B1 | * | 2/2001 | Mori et al. ................... 348/572 |
| 6,208,617 B1 | | 3/2001 | Rupp |
| 6,400,412 B1 | * | 6/2002 | Suzuki ........................ 348/572 |
| 6,473,131 B1 | * | 10/2002 | Neugebauer et al. ........ 348/572 |
| 6,489,901 B1 | | 12/2002 | Venkitachalam et al. |
| 6,490,109 B1 | * | 12/2002 | Ushirogi ....................... 360/48 |
| 6,642,863 B1 | | 11/2003 | Venkitachalam et al. |
| 6,704,493 B1 | * | 3/2004 | Matthews et al. .............. 386/98 |
| 7,136,442 B2 | * | 11/2006 | Budde et al. ................. 375/355 |
| 7,236,163 B2 | * | 6/2007 | Yoo ............................ 345/213 |

OTHER PUBLICATIONS

Vankka, et al., "A GSM/EDGE/WCDMA Modulator With On-Chip D/A Converter for Base Stations", IEEE Transactions on Circuits and Systems, vol. 49, No. 10, Oct. 2002.

\* cited by examiner

*Primary Examiner*—Victor R Kostak
(74) *Attorney, Agent, or Firm*—Andrew M. Harris; Mitch Harris, Atty at Law, LLC

(57) ABSTRACT

A video quality adaptive variable-rate buffering method and system for stabilizing a sampled video signal reduces the buffer size required to compensate for line-to-line variations in an unstable video source. A video signal is sampled at a predetermined rate and decimated by a selectable decimation factor prior to buffering. By selecting different decimation factors, the effective length of the buffer is changed from short duration for stable input signals and to longer duration for unstable input signals. A video signal quality detector is employed to provide a selection input that adjusts the decimation factor and also the loop bandwidth of a clock generator that provides the output clock for the buffer, which is generated from the input signal via a phase-lock loop (PLL). The operation of the system automatically varies from highly responsive for stable video input signals to less responsive for unstable video input signals, providing improved stability in the video output.

20 Claims, 5 Drawing Sheets

VIDEO QUALITY ADAPTIVE VARIABLE-RATE BUFFERING METHOD AND SYSTEM FOR STABILIZING A SAMPLED VIDEO SIGNAL

CROSS-REFERENCE TO RELATED APPLICATIONS

This application is related to U.S. provisional application Ser. No. 60/618,303, filed Oct. 13, 2004 and from which it claims benefits under 35 U.S.C. §119(e).

The present application is also related to the following U.S. patent applications: "INVERSE TRACKING OVER TWO DIFFERENT CLOCK DOMAINS" Ser. No. 10/964,556, filed Oct. 13, 2004; "METHOD AND SYSTEM FOR VIDEO-SYNCHRONOUS AUDIO CLOCK GENERATION FROM AN ASYNCHRONOUSLY SAMPLED VIDEO SIGNAL", Ser. No. 11/082,347, filed on Mar. 17, 2005; "METHOD AND SYSTEM FOR SYNCHRONIZING VIDEO INFORMATION DERIVED FROM AN ASYNCHRONOUSLY SAMPLED VIDEO SIGNAL", and Ser. No. 11/082,346, filed on Mar. 17, 2005.

Each of the above-referenced patent applications has at least one inventor in common with the present application and all are assigned to the same assignee. The specifications and drawings of each of the above-referenced patent applications are incorporated herein by reference.

BACKGROUND OF THE INVENTION

1. Field of the Invention

The present invention relates generally to video systems, and more specifically, to a method and system that adaptively alter a buffered video rate in response to an indication of video quality.

2. Background of the Invention

Digital audio and video systems are prevalent in the areas of home entertainment, professional production of multimedia and computer reproduction and generation of multimedia sources. In particular, systems that record a video stream are frequently coupled to source devices such as cameras and also produced from AV playback devices such as video cassette recorders (VCRs), digital versatile disc (DVD) players and compact disc (CD) players.

The above-incorporated U.S. patent applications disclose methods and system for sampling and re-clocking video data derived from an input video source for the purposes of recording or processing the video data. However, there is a significant difference between a system optimized for processing a very stable video source signal, such as that produced by a camera or DVD player and a system optimized for processing a relatively unstable source, such as that provided by a VCR.

Due to the mechanical extraction of video information that occurs in a VCR, mechanical variations (jitter) in the video signal (pixels) cause the length and position of lines to vary dramatically. The field synchronization is typically more stable, as the vertical fields are synchronized with the vertical sync signal generated by the head pulses. The variations in line position are typically uncompensated, particularly in consumer VCRs, so the line-to-line variation typically requires buffering an entire field of video in order to produce a stable output representation for sampling. Also, because of the need to provide stable synchronization information in the output video that is locked to the source rate of the video, a slow response (i.e., low bandwidth) clock generator is typically required to generate the output video synchronization signal.

However, for stable video sources, it is desirable to have a shorter buffer and a more responsive clock generating circuit, so that acquisition time and latency are reduced, as well as cost associated with the video buffer, which can be a large amount of memory at the high sampling and oversampling rates required for video capture.

Therefore, it would be desirable to provide a method and system for stabilizing a sampled video signal from an unstable input video source with minimum buffer space. It would further be desirable to provide such a method and system that has a fast acquisition time and low latency for high-quality video signal sources, while maintaining a sufficiently stabilized clock generator and buffering for lower-quality video signal sources. It would also be desirable to provide such a method and system that automatically adapt to the quality of an input video signal.

SUMMARY OF THE INVENTION

The above stated objective of stabilizing a video signal with minimum buffer size is achieved in an adaptive method and system for stabilizing video information obtained from a sampled video signal.

The system includes a first-in first-out (FIFO) buffer that receives sampled video data at a rate selected via a selectable decimation factor. The decimation factor is selected in conformity with a detected quality level of the input video signal, thereby adjusting the effective buffer length of the FIFO with respect to time.

A line-locked clock is generated by a phase-lock loop (PLL) for clocking the video data out of the FIFO buffer, and the bandwidth of the PLL is also adjusted in conformity with the detected quality level of the input video signal, thereby providing a highly-responsive synchronization generator for high-quality video signals, and a stable frequency-averaged synchronization signals when a lower-quality video source is received.

A sample rate converter provided by a time-varying filter is used as an interpolator to convert the FIFO output date from the decimated sample rate to the rate of the line-locked clock.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a method and system that adapt to the quality of an incoming video signal in order to provide adequate buffering to stabilize the video signal in the form of sampled data, without requiring a large buffer. In general, the buffer size required by the present invention is equal to or less than half of a video line for the lowest quality video signal. The buffer size is further reduced by decimating a lower quality video signal before clocking the video data into the buffer, so that a buffer that is, for example, 1/16 of a line deep at the full sampling rate, can be ½ line at a decimation factor of 8.

The purpose of buffering ½ line for lower-quality video signals is to correct signals such as VCR signals, which tend to have a high jitter between horizontal sync (hsync) pulses. In prior art applications, a full field or frame buffer is typically used and the line-to-line variations are made up when the field or frame buffer is clocked out. However, in the clock generating systems described in the above-incorporated patent applications, the generated source-locked clock is sufficiently stable that a full field or frame buffer is not required in order to stabilize the output video data. As long as enough buffering is provided to compensate for the amount of jitter present in the input lines, the data can be clocked out by the source-locked clock from a partial line buffer. By providing a half line buffer for the lowest quality video signals, the position of a line can be corrected for a worst-case difference between the hsync pulses and the correct position of the pulse with respect to the video data.

The video signal is sampled at a stable sampling rate provided by a crystal-controlled clock, and a quality level of the video signal is determined by measuring the hsync to hsync variation. A very stable source-locked clock is generated from the average value of the hsync pulses (or alternatively from the vertical sync pulses) extracted from the video data by a filter. The video data is clocked into the buffer at the decimated sampling rate and is clocked out at the stable source-locked clock rate, eliminating the line variation present in the original video signal.

Adaptive control of the source-locked clock response and the effective buffer length is performed in response to the output of the quality detector, which may be a single bit of control or may be a multi-bit control word. In the exemplary embodiment, the control word is three bits, corresponding to an effective buffer length that varies from 1/16 line to ½ line of samples at a corresponding decimation factor controlled by the control word. A sample rate converter at the output of the buffer converts the data from the decimated rate to the rate of the source-locked clock. The PLL that generates the source-locked clock has a bandwidth controlled by the control word, providing an increasing level of stabilization/filtering as the video quality decreases.

Figure 1:
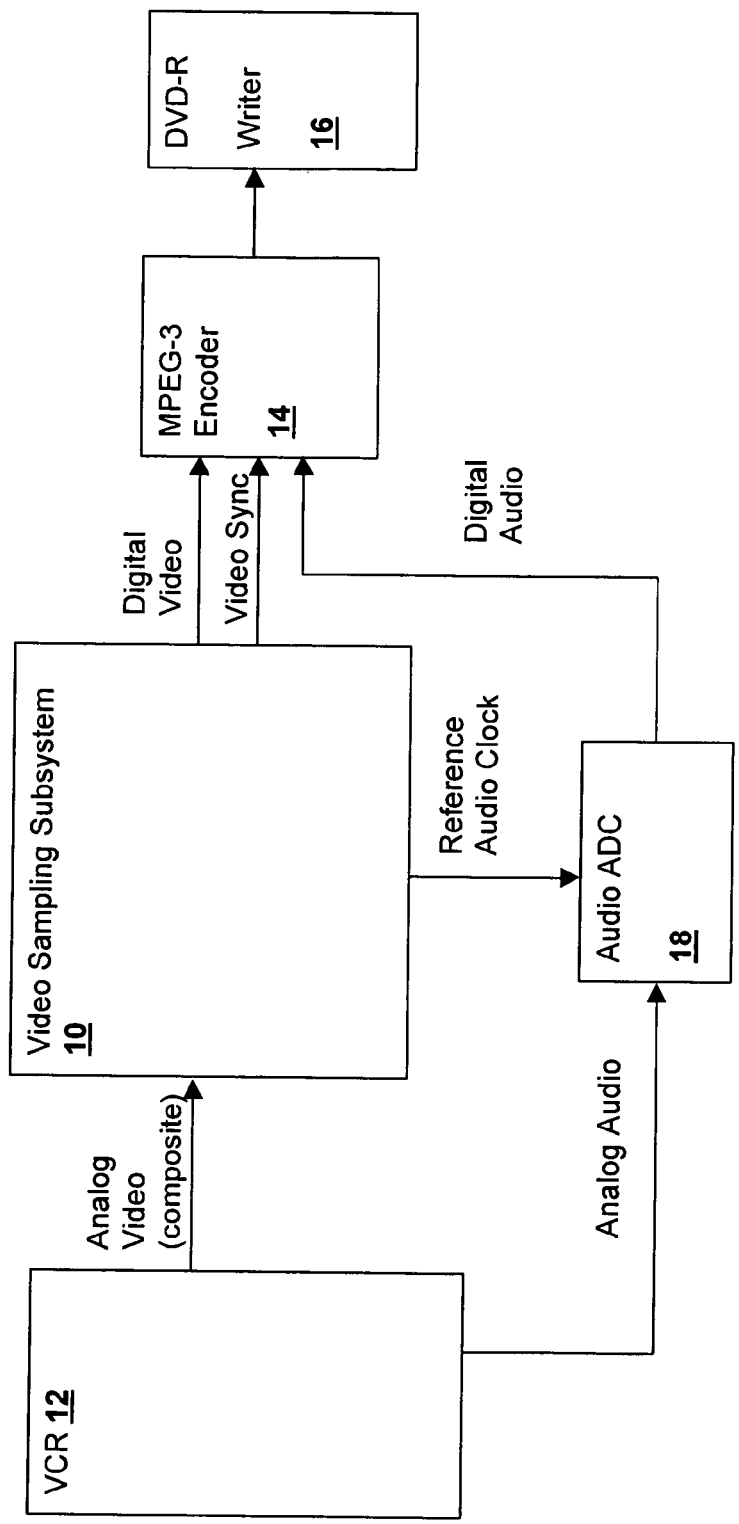
FIG. 1 is a block diagram depicting application of a system 10 in accordance with an embodiment of the present invention.

Referring now to FIG. 1, an application of a video sampling subsystem 10 in accordance with an embodiment of the invention is illustrated. The depicted application is video capture of a video cassette recorder (VCR) 12 output for storage on a digital versatile disc (DVD) via a DVD-R writer 16. Video processing subsystem 10 receives a composite video signal such as an NTSC or PAL signal from VCR 12 and generates video synchronization information (Video Sync) that is provided to MPEG-3 Encoder 14, and which may be a parallel multi-bit number indicating the video ratio, an absolute phase ramp (phase/time ramp), other numeric indicator of the video rate or may be a physical video clock signal. In the illustrative embodiment, a physical clock signal is generated for clocking data out of the buffer, so generation of a physical source-locked clock is illustrated herein. However, it should be understood that numeric synchronization information may also be generated as described in the above-incorporated patent applications.

An audio analog-to-digital converter (ADC) 18 receives the analog audio signals from VCR 12. ADC 18 should be understood to include anti-aliasing filters and data conversion elements to provide a proper digital audio output to MPEG-3 encoder 14, which may be wide parallel data, or a serial signal such as an S/P-DIF signal. MPEG-3 encoder 14 receives the sampled digital video produced by video sampling subsystem 10, which may be wide data or a serial digital interface such as DV-I. MPEG-3 encoder bundles the received digital audio and video into an encoded and compressed file stream for storage by DVD-R writer 16.

Figure 2:
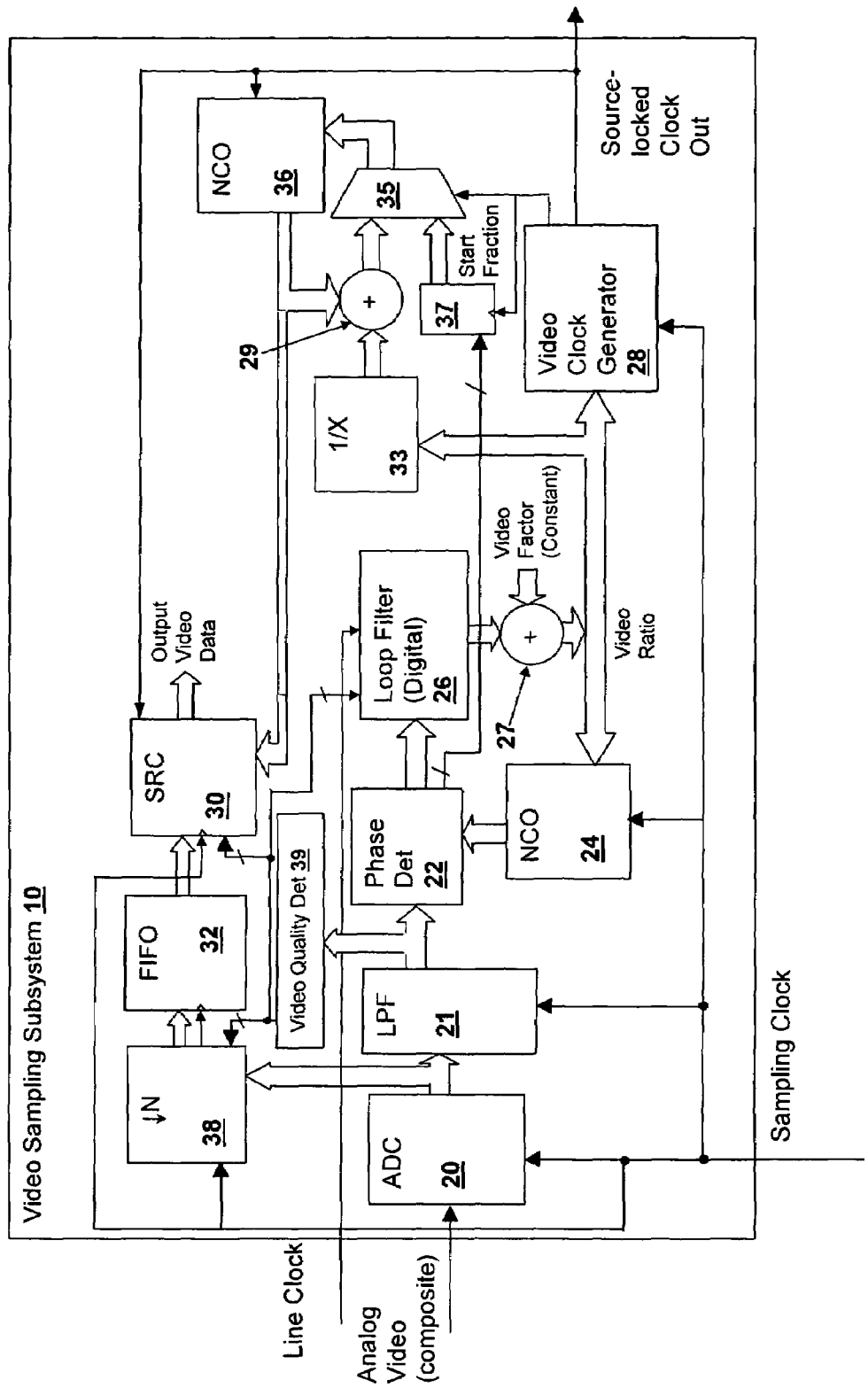
FIG. 2 is a block diagram depicting details of system 10.

Referring now to FIG. 2, details of system 10 in accordance with an embodiment of the invention are shown. The analog (composite) video input signal is received and converted by an ADC 20 operating at the frequency of a provided sampling clock. Generally, the data will be separated into component video after sampling, but separation is not a requirement of the present invention. If the separation is performed on the output of ADC 20, then any error in the chroma and luminance demodulation is reduced. The video data is then decimated by a decimator 38 and clocked into a FIFO buffer 32 at the decimated rate.

The output of ADC 20 is also digitally-filtered by low-pass filter (LPF) 21, which removes video and audio information, leaving only synchronization information, which can be at the line rate or the frame rate (or field rate). Jitter in the synchronization information is measured by a video quality detector 39 that produces one or more control bits in response to a level of jitter (or absolute line or field length error) present in the video signal. It should be noted that video quality detector 39 could alternatively be coupled to an analog circuit that filters the synchronization information from the composite video signal and thus measures the video signal jitter level prior upstream of conversion. Measurement can be made via a counter scheme as described below for video quality detector 39, or by analog jitter measurement techniques such as an eye-diagram PLL-based detector. As long as video quality detector 39 can make a determination of the level of buffering and clock stabilization necessary to stabilize the sampled video stream, the present invention can automatically adjust to stabilize the output video data and corresponding source-locked clock.

The filtered synchronization information is also passed to a phase detector 22 which compares the phase of the video synchronization data to the digital output of a local timebase formed by a numerically controlled oscillator (NCO) 24 and provides phase-correction error output to a loop filter 26 that closes the PLL by providing the control input to NCO 24 through an adder 27. The bandwidth of loop filter 26 is decreased in response to a detected level of jitter provided by the control word output of video quality detector 39, so that as jitter increases, the averaging time constant of the PLL is increased. The source-locked clock frequency is thereby locked to an average value of line length of the incoming video, and an increasingly long averaging period is supplied as the jitter in the input video signal increases. Adder 27 receives a number constituting a video factor that is added to the output of loop filter 26 to generate a frequency offset. The video factor is determined from the known difference between the video source frequency and the sampling frequency and may be adjusted programmatically to adapt to various video rates.

The output of adder 27 is a slowly-varying or essentially constant number corresponding to the ratio between the sampling clock rate and the video source clock rate, labeled "video ratio". Loop filter 26 receives a line clock signal derived from other processing circuits that is synchronous with the video source line frequency. The line clock signal is used to synchronize the processing in the loop filter to avoid aliasing error that would occur through phase detector 22 due to the difference between the source video sync rate and the sync rate as sampled and appear as a "beat frequency" at the output of loop filter 26. Such beat frequencies can approach DC values and therefore are eliminated rather than filtered.

The video ratio is also provided to an inverse function block 33 that generates a numeric output functionally inverse to the video ratio and therefore corresponding to a second ratio of the video source line rate to the sampling clock frequency. The second (inverted) ratio provides an input to a second NCO 36 through multiplexer 35. NCO 36 generates a number (a) that controls a sample rate converter (SRC) 30 by adjusting coefficients of an interpolation filter. SRC 30 also receives the control word from video quality detector 39 so that the video data is converted from the decimated rate supplied by decimator 38 to the rate of the source-locked clock generated by video clock generator 28.

The second NCO 36 output is further supplied as feedback to an adder 29 that combines the inverse ratio from inverse function block 33 in combination with the output of NCO 36 to provide the input to NCO 36, when multiplexer 35 is in its normal operating state. The select input of multiplexer 35 is pulsed at the start of each line (or frame or field if the ratio is based on the frame or field) and causes a start fraction value to be loaded into NCO 36 at the beginning of each video sync interval. The start fraction is a value dependent on the sync rate of the incoming video and the desired output sync rate, which is obtained by latching a remainder value out of phase detector 22 via a latch 37. The feedback through adder 29 causes NCO 36 to generate a linearly varying progressive phase number a that is used by SRC 30 to interpolate digital video samples received from ADC 20 and stored in FIFO 32 to be synchronized with the new line rate.

While the above described circuits use a digital NCO 24 and a digital phase detector 22 that receives a waveform representation (generally parallel binary data that represents a ramp signal integrator output for phase-locking with the filtered input video sync data, which is also parallel digital data), other circuit embodiments, both digital and analog are contemplated by the present invention. In particular, NCO 24 may generate an actual signal waveform that is phase compared with either a digital or analog filtered sync signal, and NCO may be replaced with a voltage-controlled oscillator (VCO) with an appropriate analog loop filter and analog adders/multipliers, or portions of the above-circuits may be implemented in analog circuits with appropriate A/D or D/A converters between disparate blocks. Also, a digital timebase input to phase detector 22 may be any digital representation of phase, which may be a parallel multi-bit number representing an absolute phase ramp (phase/time ramp) or other numeric indicator of the phase and frequency, such as numbers indicating an edge position and pulse width, etc.

Figure 3:
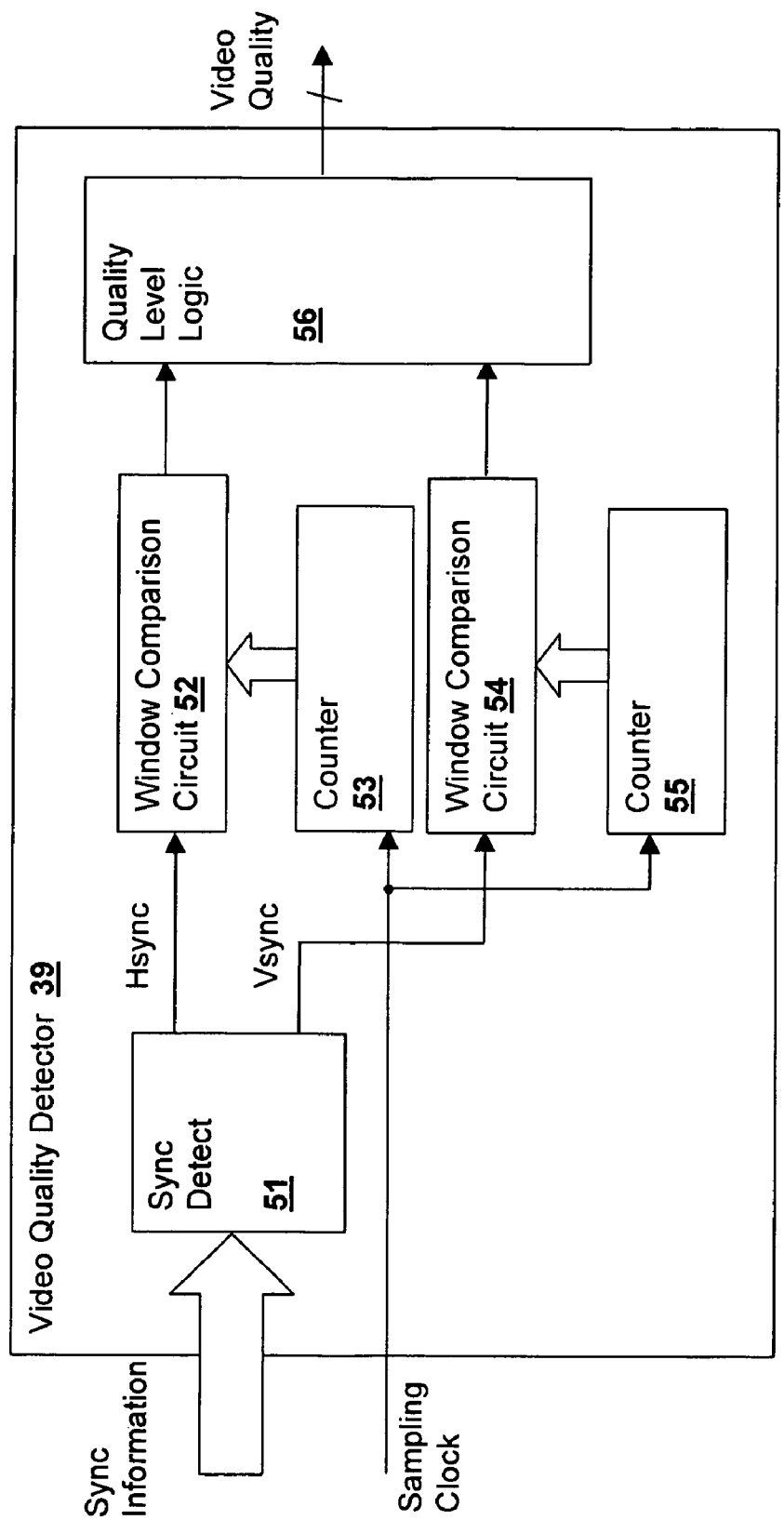
FIG. 3 is a block diagram showing details of video quality detector 39 of FIG. 2.

Referring now to FIG. 3, details of video quality detector 39 are shown. A sync detector 51 determines a synchronization point for vertical and horizontal information from the filtered video data supplied by low pass filter 21. Generally, the synchronization point is the trailing edge of the corresponding video sync pulse. A pair of window comparison circuits 52 and 54 compare the synchronization points to expected synchronization locations as generated by a pair of counters 53 and 55 from the sampling clock. The windows may be provided by a decode of the counter 53, 55 outputs and are sufficiently wide to account for the maximum frequency deviation of the sampling clock frequency and a corresponding frequency tolerance in the received video frequency. As jitter in the video input signal increases, the horizontal sync pulses (and possibly the vertical sync pulses) will occur outside of the window, and one or both of window comparison circuits 52 and 54 will trigger quality level logic 56 to change the video quality control word to indicate that a lower quality video signal is being sampled.

Multiple levels of quality information can be derived by either using additional window comparison circuits having corresponding window widths, or by counters within quality level logic 56 that determine a relative frequency of deviations of the video input signal synchronization pulses from the windows set by window comparison circuits 52 and 54.

Figure 4:
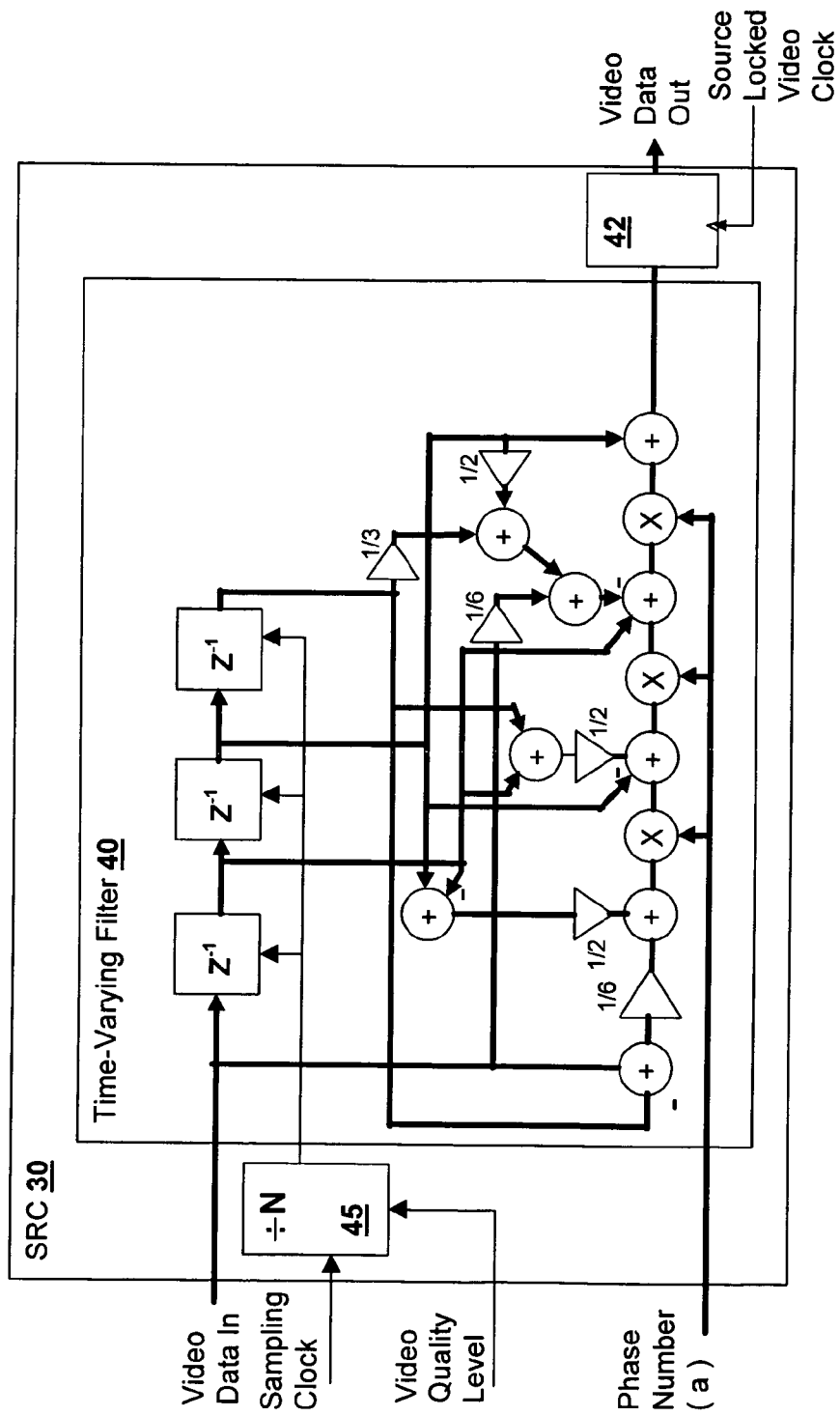
FIG. 4 is a block diagram showing details of sample rate converter 30 of FIG. 2.

Referring now to FIG. 4, details of SRC 30 are shown. A time-varying filter 40 implements an interpolator that receives the phase number a which adjusts the filter coefficients to interpolate the incoming video data to a new phase space. The stages of the filter are clocked by the sampling clock reduced by a programmable divider 45 that receives the control word output of video quality detector 39. However, filter 40 may alternatively be operated at the sampling clock frequency if a programmable number of stages are employed as controlled by the control word output of video quality detector 39. The output of filter 40 is latched by a latch 42 clocked by the source-locked video clock produced by video clock generator 28, so that the output video data samples are synchronous with the source-locked clock. The result is that SRC 30 converts the samples received from FIFO 32 that were stored at the decimated video rate selected by video quality detector 39 to the rate corresponding to the stabilized source-locked clock generated by video clock generator 28.

Time-varying filter 40 may be any interpolation filter that meets the quality requirements for the video data output, but is depicted as a third-order (cubic) LaGrange interpolator that implements the Z-transform:

$$H(z)=p_3(\alpha)z^{-3}+p_2(\alpha)z^{-2}+p_1(\alpha)z^{-1}+p_0(\alpha)$$

$$\text{where } p_k(\alpha) = -\prod_{\substack{n=0 \\ n \neq k}}^{3} (\alpha - n)/(k - n)$$

The resulting action of filter 40 third-order-interpolates the input samples at a progressive phase factor specified by the phase difference between the sampling clock and the line-locked clock reference. Filter 40 thereby translates the sample rate of the incoming data to synchronize the output video data with the generated video line-locked clock.

Further details of SRC converter logic, phase control and filter implementation are disclosed in: "ASYNCHRONOUS SAMPLE RATE CONVERTER", U.S. Pat. No. 6,208,671 to Paulos, et al.; "VARIABLE DUTY CYCLE RESAMPLING CIRCUITS AND METHODS AND SAMPLE RATE CONVERTERS USING THE SAME", U.S. Pat. No. 6,489,901 to Venkitachalam, et al.; and "SAMPLE RATE CONVERTERS USING VIRTUAL SAMPLE RATES AND ANALOG TO DIGITAL AND DIGITAL TO ANALOG CONVERTERS USING THE SAME", U.S. Pat. No. 6,642,863, also to Venkitachalam, et al. The specifications and drawings of the above-referenced Patents are incorporated herein by reference.

Figure 5:
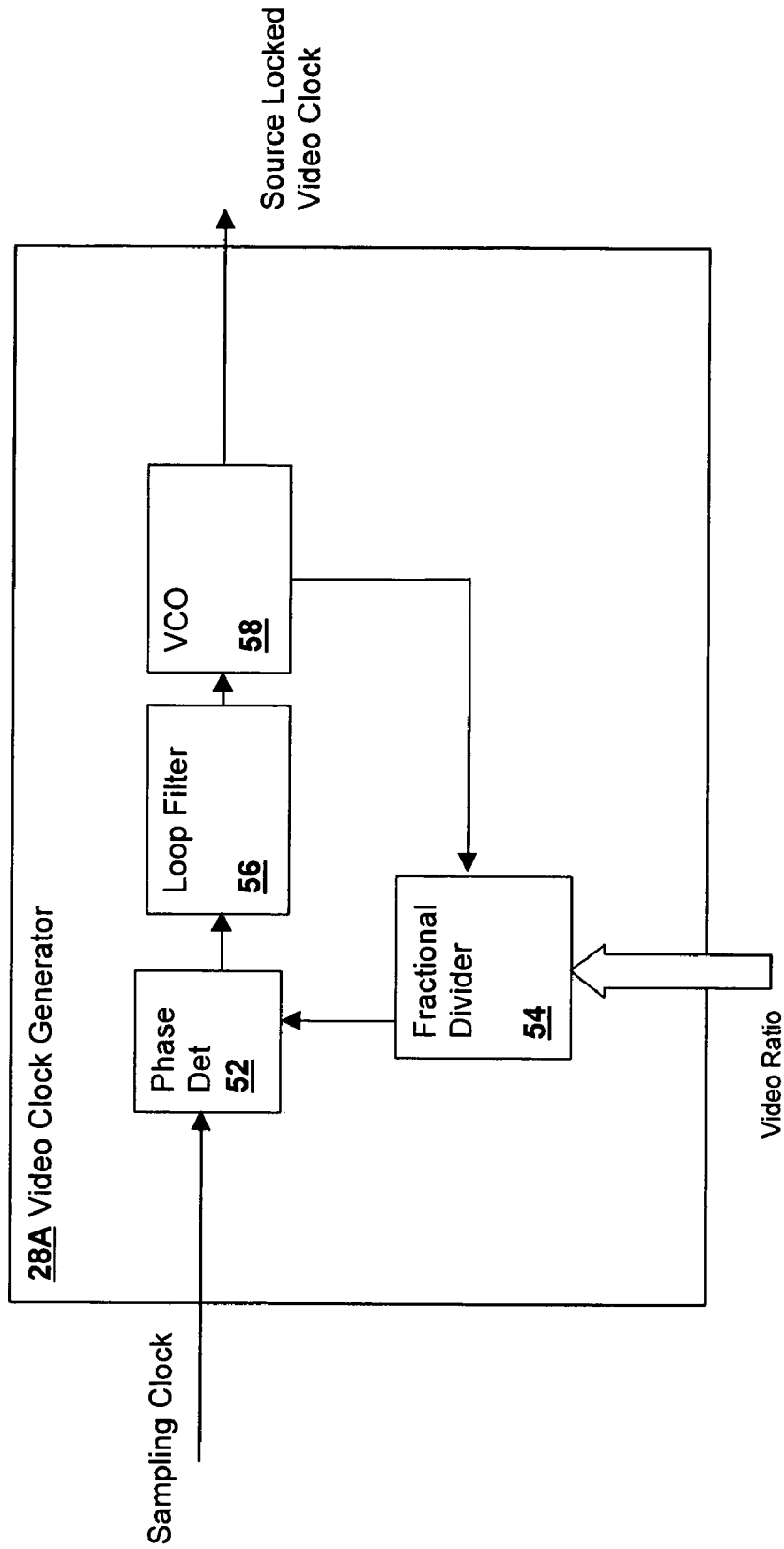
FIG. 5 is a block diagram showing details of an embodiment of video clock generator 28 of FIG. 2.

Referring now to FIG. 5, details of a video clock generator 28A that may be used to implement video clock generator 28 of FIG. 2 is depicted in a block diagram. A fractional divider 54 receives the sampling clock/audio clock frequency ratio and divides the output of a voltage controlled oscillator (VCO) 58 to match phase and frequency with the sampling clock input (which may be prescaled from the master sampling clock). Fractional divider 54 is a delta/sigma circuit that generates an average pulse signal corresponding to the input (VCO 58 output) value divided by the divisor (video ratio) value. A loop filter 56 provides the voltage control input to VCO 58 to close the loop, so that VCO 58 generates a video clock having a frequency equal to the sampling clock rate divided by the video ratio.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method for digitizing and stabilizing video signal, comprising:
    sampling said video signal at a predetermined rate to produce sampled video data;
    detecting a quality level of said video signal;
    selecting a decimation factor in conformity with said detected quality level;
    decimating said sampled video data by said selected decimation factor;
    storing said decimated video data in a buffer at a rate corresponding to said predetermined rate scaled by said decimation factor; and
    clocking said decimated video data out of said buffer with a line clock locked to a rate of said video signal, whereby said buffer provides a variable buffer duration determined in conformity with said detected quality level.

2. The method of claim 1, further comprising:
    generating said line clock from said video signal with a phase-lock loop; and
    adjusting a bandwidth of said phase-lock loop in conformity with said detected quality level.

3. The method of claim 1, further comprising converting a rate of said decimated video data to a rate differing from a rate of said sampling clock to form a new video data stream synchronized with said line clock.

4. The method of claim 1, wherein said selecting selects said decimation factor from a range of decimation factors, and wherein said storing stores said decimated video data in a buffer having a size less than or equal to one half of a line of said decimated video signal at a maximum decimation factor of said range.

5. The method of claim 1, wherein said detecting a quality level is performed by:
    measuring a length of each line of said video signal; and
    determining whether or not said length of said each line deviates from an expected line length by a threshold.

6. The method of claim 5, wherein said measuring comprises:
    detecting a line synchronization signal within said sampled video signal; and
    counting at said predetermined rate from a reference point of a last line synchronization signal, and wherein said determining is performed by determining whether or not a next line synchronization signal occurs within a predetermined window around an expected time corresponding to said expected line length.

7. The method of claim 5, wherein said detecting a quality level further comprises:
    measuring a time interval between arrival of fields of said video signal; and
    determining whether or not said time interval deviates from an expected field interval by a threshold.

8. The method of claim 1, wherein said detecting a quality level further comprises:
    measuring a time interval between arrival of fields of said video signal; and
    determining whether or not said time interval deviates from an expected field interval by a threshold.

9. A circuit for digitizing and stabilizing a video signal, comprising:
    a signal quality detector for detecting a quality of said video signal;
    an analog to digital converter for receiving said video signal and providing a digitized video signal stream;
    a decimator having a programmable decimation factor for decimating said digitized video signal stream, and wherein said decimator is coupled to said signal quality detector for setting said programmable decimation factor in conformity with said detected quality; and
    a buffer for storing said decimated digitized video signal stream, and wherein said decimated digitized video signal stream is clocked out of said buffer with a line clock locked to a rate of said video signal, whereby said buffer provides a variable buffering duration determined in conformity with said detected quality level.

10. The circuit of claim 9, further comprising a clock generator for generating said line clock comprising a phase-lock loop, said phase-lock loop having a variable bandwidth determined in conformity with a control input that receives an indication of said quality level from said signal quality detector.

11. The circuit of claim 9, further comprising a sample rate converter coupled to said buffer for converting said decimated digitized video signal to a rate of said line clock.

12. The circuit of claim 9, wherein said programmable decimation factor is selected from a range of decimation factors, and wherein said buffer has a size less than or equal to one half of a line of said decimated video signal at a maximum decimation factor of said range.

13. The circuit of claim 9, wherein said signal quality detector comprises:
    a counter for counting a length of each line of said video signal; and
    a comparison circuit coupled to said counter for determining whether or not said length of said each line deviates from an expected line length by a threshold.

14. The circuit of claim 13, further comprising a sync detector for detecting a line synchronization signal within said digitized video stream, and wherein said counter is clocked at a predetermined pixel rate from a reference point of a last line synchronization signal, and wherein said comparison circuit determines whether or not a next line synchronization signal occurs within a predetermined window around an expected time corresponding to said expected line length.

15. The circuit of claim 13, wherein said signal quality detector further comprises:
    another counter for measuring a time interval between arrival of fields of said video signal; and
    another comparison circuit for determining whether or not said time interval deviates from an expected field interval by a threshold.

16. The circuit of claim 9, wherein said signal quality detector further comprises:
    another counter for measuring a time interval between arrival of fields of said video signal; and
    another comparison circuit for determining whether or not said time interval deviates from an expected field interval by a threshold.

17. A circuit for digitizing and stabilizing a video signal, comprising:

an analog to digital converter for receiving said video signal and providing a digitized video signal stream;

a fixed length buffer for storing a representation of said digitized video stream;

means for varying an effective fractional line length of said buffer in conformity with a quality of said video signal.

18. The circuit of claim 17, further comprising means for clocking said representation of said digitized video stream at a stabilized rate determined from a source clock of said digitized video stream and having a responsiveness to variations in said source clock determined according to a time constant, and wherein said time constant is dynamically selected in conformity with said quality of said video signal.

19. The circuit of claim 17, wherein said means for varying varies said effective fractional line length in response to detected variation in a number of pixels per line of said video signal.

20. The circuit of claim 19, wherein said means for varying varies said effective fractional line length further in response to detected variation in a number of pixels per field of said video signal.

* * * * *